(12) United States Patent
Kuniya

(10) Patent No.: US 9,397,140 B2
(45) Date of Patent: Jul. 19, 2016

(54) METHOD OF MANUFACTURING SEMICONDUCTOR DEVICE

(71) Applicant: KABUSHIKI KAISHA TOSHIBA, Minato-ku (JP)

(72) Inventor: Takuji Kuniya, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 365 days.

(21) Appl. No.: 14/180,647

(22) Filed: Feb. 14, 2014

(65) Prior Publication Data
US 2015/0037931 A1 Feb. 5, 2015

(30) Foreign Application Priority Data
Jul. 30, 2013 (JP) ................. 2013-157725

(51) Int. Cl.
*H01L 21/00* (2006.01)
*H01L 21/8234* (2006.01)
*H01L 27/24* (2006.01)
*H01L 45/00* (2006.01)

(52) U.S. Cl.
CPC ........ *H01L 27/2409* (2013.01); *H01L 27/2481* (2013.01); *H01L 45/04* (2013.01); *H01L 45/06* (2013.01); *H01L 45/1233* (2013.01); *H01L 45/144* (2013.01); *H01L 45/146* (2013.01); *H01L 45/148* (2013.01); *H01L 45/1675* (2013.01)

(58) Field of Classification Search
CPC ........................... H01L 21/00; H01L 21/8234
See application file for complete search history.

(56) References Cited

U.S. PATENT DOCUMENTS

| 6,607,985 | B1 | 8/2003 | Kraft et al. |
| 7,166,538 | B2 | 1/2007 | Doshita |
| 8,158,516 | B2 | 4/2012 | Kuniya |

FOREIGN PATENT DOCUMENTS

| JP | H09-199484 A | 7/1997 |
| JP | H10-247641 A | 9/1998 |
| JP | H11-111689 A | 4/1999 |
| JP | H11-135481 A | 5/1999 |
| JP | 2004-31546 A | 1/2004 |
| JP | 2011-187557 A | 9/2011 |

*Primary Examiner* — Marvin Payen
(74) *Attorney, Agent, or Firm* — Oblon, McClelland, Maier & Neustadt, L.L.P.

(57) ABSTRACT

A method of manufacturing a semiconductor device includes forming a stack of films including a conductive film layer above a semiconductor substrate; patterning the stack of films by dry etching; and cleaning including generation of plasma in an ambient including $BCl_3$ and controlling a bias power to a nonbiased state.

11 Claims, 12 Drawing Sheets

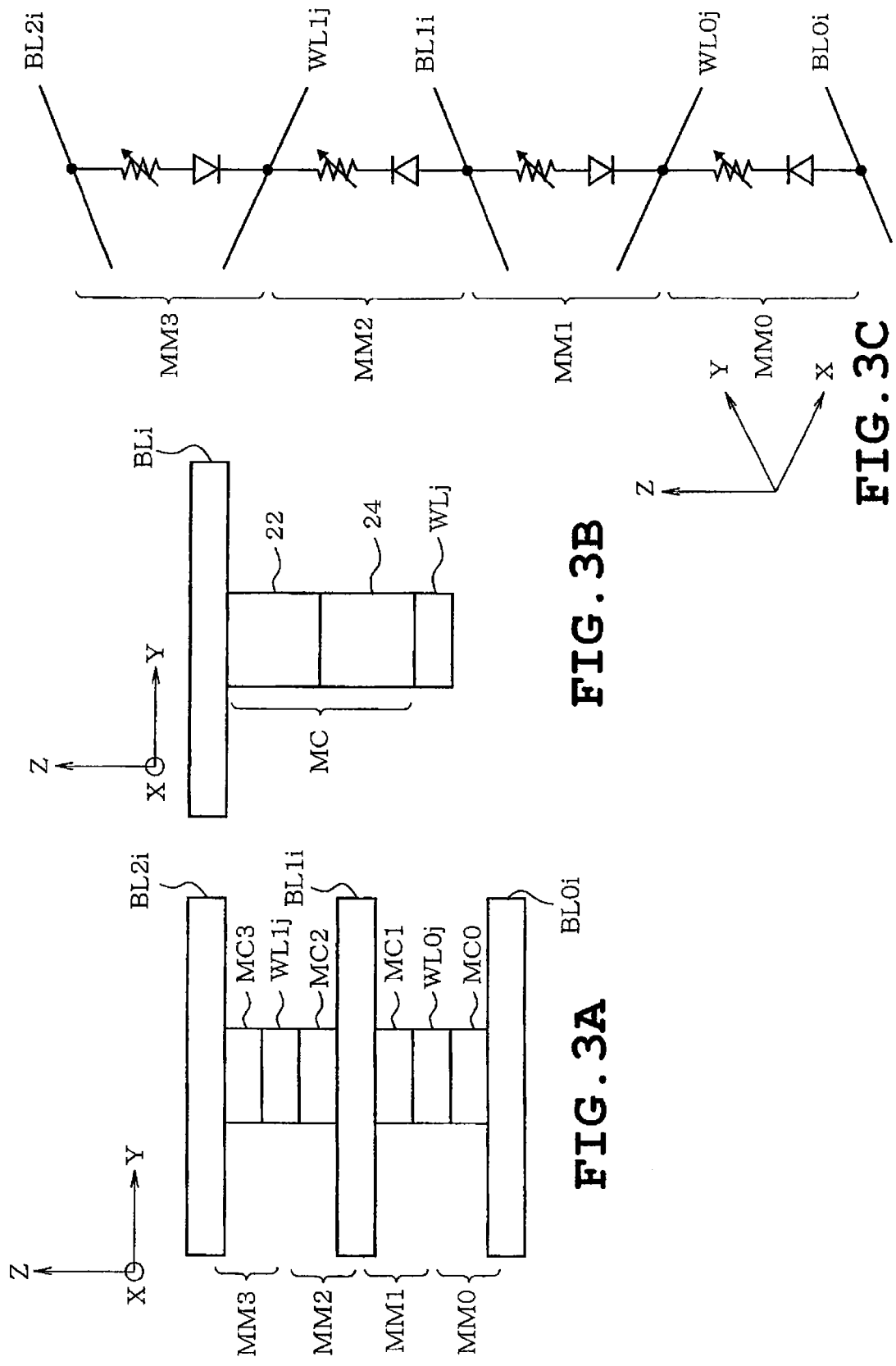

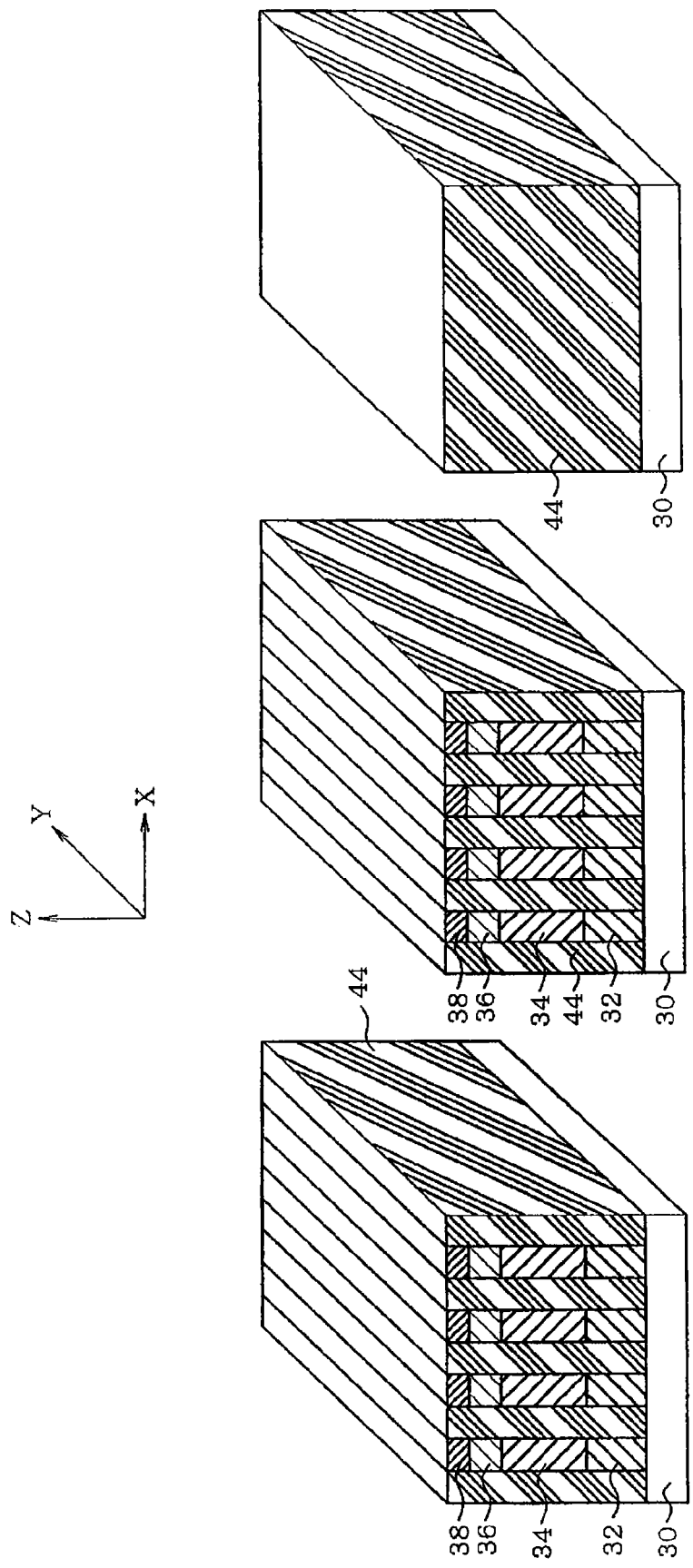

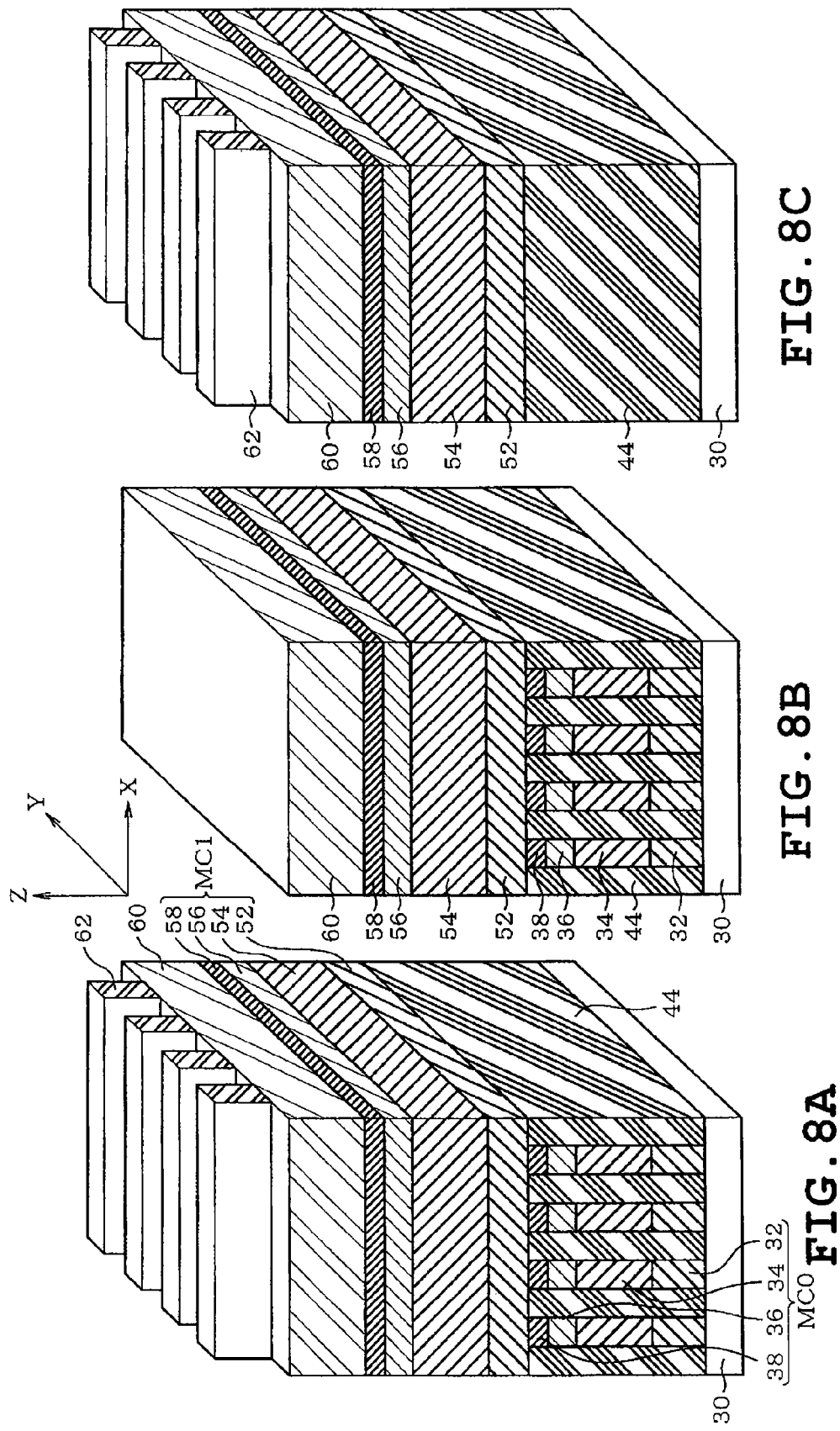

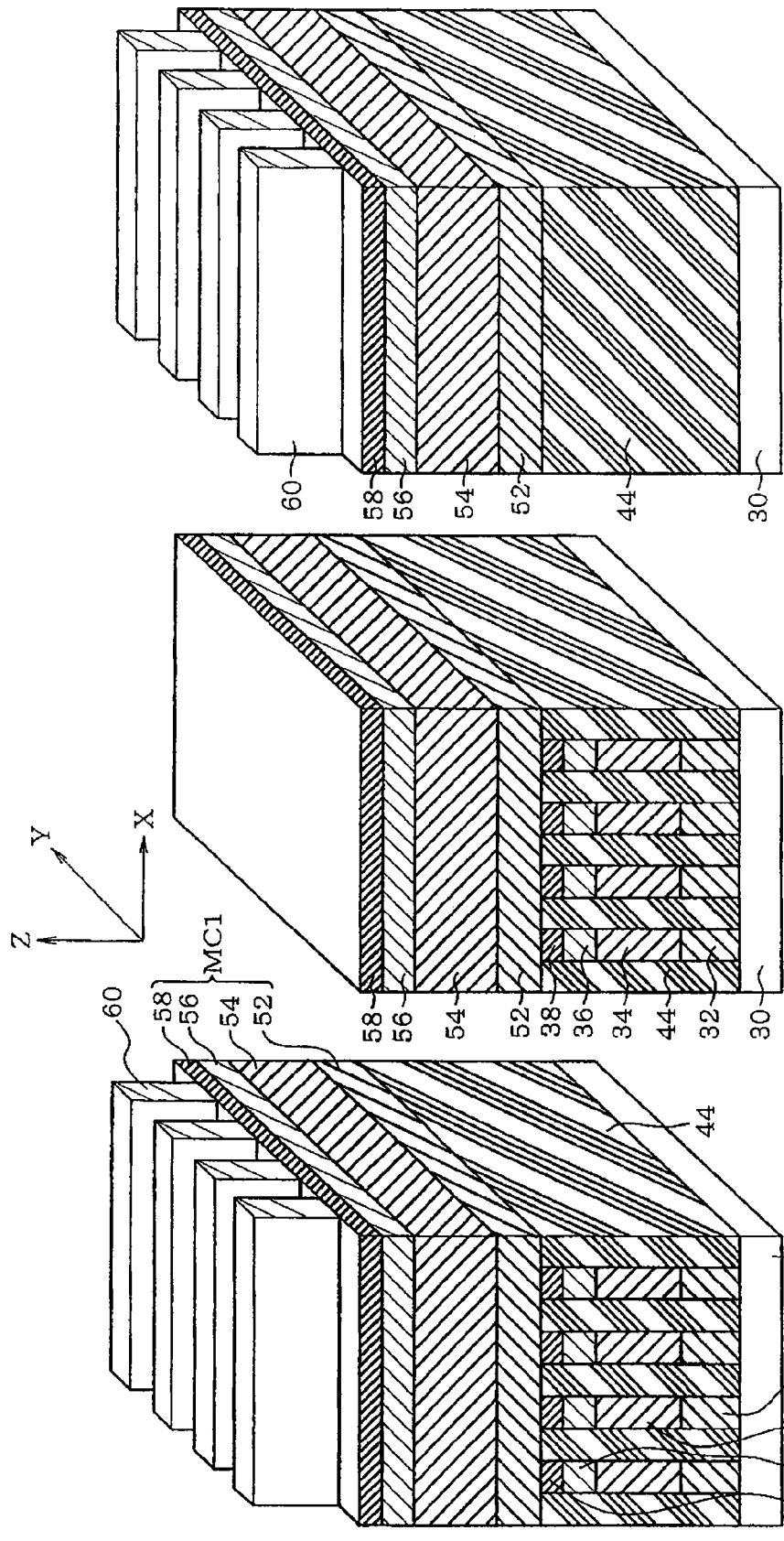

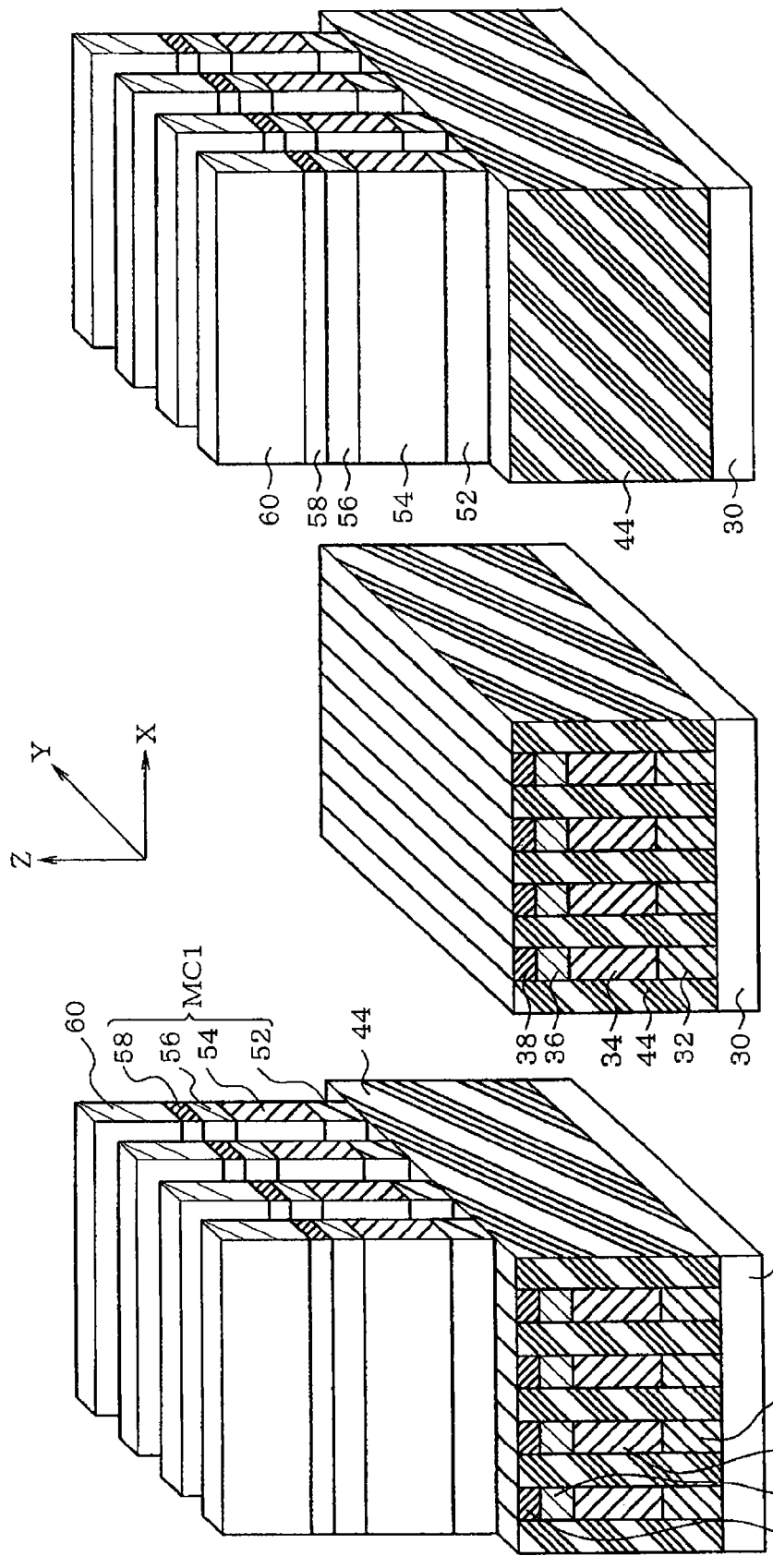

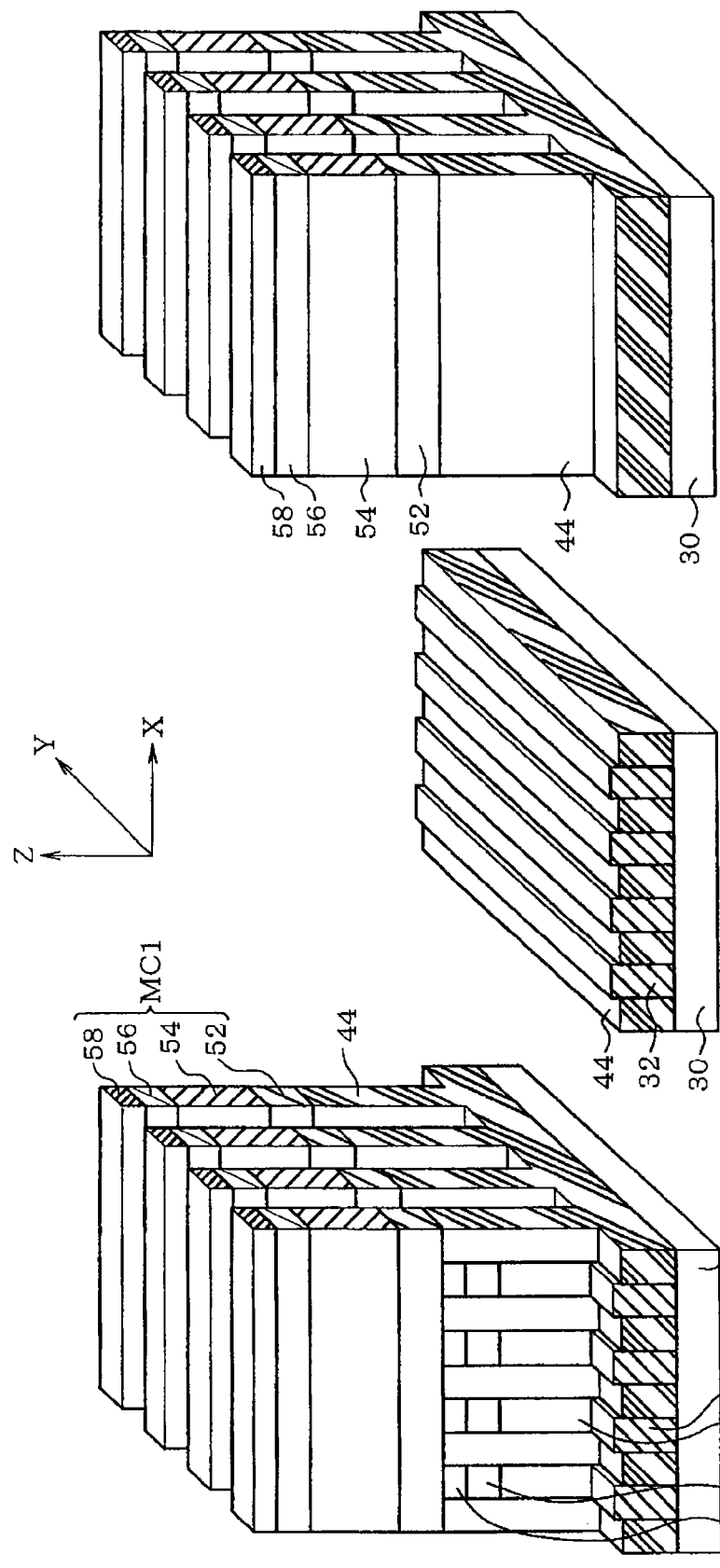

METHOD OF MANUFACTURING SEMICONDUCTOR DEVICE

CROSS-REFERENCE TO RELATED APPLICATION(S)

This application is based upon and claims the benefit of priority from Japanese Patent Application No. 2013-157725, filed on, Jul. 30, 2013 the entire contents of which are incorporated herein by reference.

FIELD

Embodiments disclosed herein generally relate to a method of manufacturing a semiconductor device.

BACKGROUND

A nonvolatile semiconductor storage device such as ReRAM (Resistance Random Access Memory) is becoming popular for its capacity to store large amount of data and for its ease in three dimensionalization. The data storing portion of ReRAM, which may be a stacked structure disposed between a word line and a bit line, may comprise metal such as tungsten. When processing the stacked structure including metal by dry etching, for example, the metal may be ejected by the sputtering effect of ions and develop deposits including metal at the bottom portions of patterns. This may lead to shorting of adjacent patterns.

BRIEF DESCRIPTION OF THE DRAWINGS

FIG. 3A is one example of a vertical cross sectional view schematically illustrating a cross section of a single memory cell group taken along line 3A-3A of FIG. 2.

FIG. 3B is one example of a vertical cross sectional view schematically illustrating a cross section of a single memory cell.

FIG. 3C is one example of an equivalent circuit representation of FIG. 3A.

FIGS. 4A to 12A are examples of perspective views schematically illustrating the structures of a semiconductor device and its manufacturing process flow of one embodiment.

FIGS. 4B to 12B are examples of perspective views schematically illustrating the structures of a hook up portion of a bit line and its manufacturing process flow of one embodiment.

FIGS. 4C to 12C are examples of perspective views schematically illustrating the structures of a hook up portion of a word line and its manufacturing process flow of one embodiment.

DESCRIPTION

In one embodiment, a method of manufacturing a semiconductor device is disclosed. The device includes forming a stack of films including a conductive film layer above a semiconductor substrate; patterning the stack of films by dry etching; and cleaning including generation of plasma in an ambient including $BCl_3$ and controlling a bias power to a nonbiased state.

Embodiments

Embodiments are described hereinafter with reference to FIGS. 1 to 12. The drawings are merely schematic and not drawn to scale and thus, do not reflect the actual measurements of the features such as the correlation of thickness to planar dimensions and the relative thickness of different layers. Further, directional terms such as up, down, lower, left, and right are used in a relative context with an assumption that the surface, on which circuitry is formed, of the later described semiconductor substrate faces up. Thus, the directional terms do not necessarily correspond to the directions based on gravitational acceleration. In the following description, XYZ orthogonal coordinate system is used for ease of explanation. In the coordinate system, the X direction and the Y direction indicate directions parallel to the surface of a semiconductor substrate and are orthogonal to one another. The X direction indicates the direction in which word line WL extends, and the Y direction, being orthogonal to the Y direction, indicates the direction in which bit line BL extends. The Z direction indicates the direction orthogonal to both the X direction and the Y direction. The embodiments will be described through a cross-point type ReRAM application which is one example of a semiconductor device. Alternative technologies will be mentioned as required.

Figure 1:
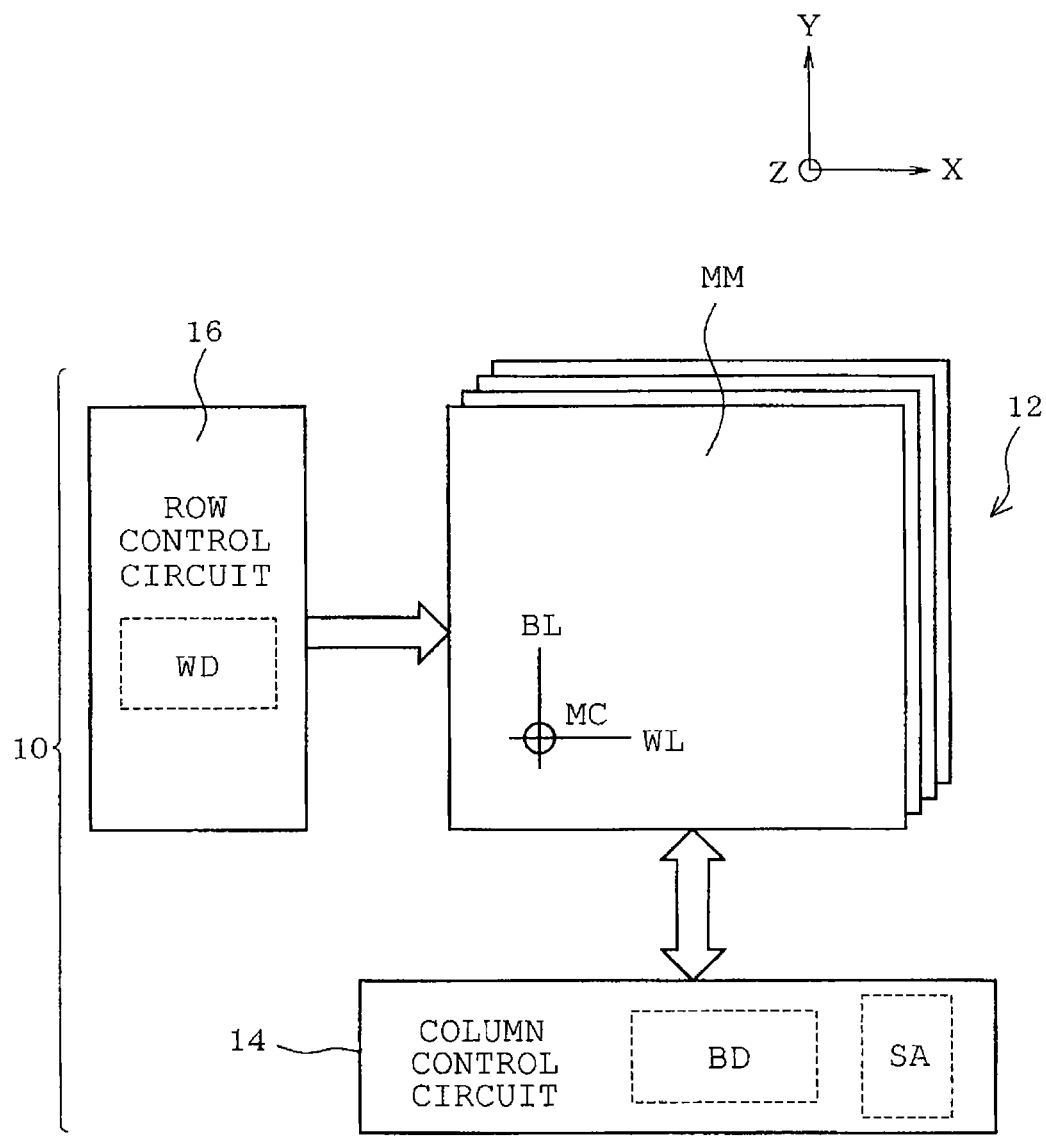
FIG. 1 is one example of a block diagram illustrating the overall structure of a semiconductor device of one embodiment.

FIG. 1 is one example of a schematic block diagram illustrating the overall structure of a semiconductor device of one embodiment. FIG. 1 illustrates ReRAM 10, which may also be referred to as a resistance variable memory, as one example of a semiconductor device. ReRAM 10 is provided with memory cell array 12. Memory cell array 12 includes stacks of memory cell mats MM (memory cell layers).

Each memory cell mat MM includes bit lines BL, word lines WL, and memory cells MC disposed at the intersections of word lines WL and bit lines BL. Memory cell mats MM are stacked and thus, memory cell array 12 comprises memory cells MC arranged in a three-dimensional matrix. Memory cells MC will be later described in detail. Memory cell MC includes variable resistor 22 and current rectifier 24 as shown in FIG. 3B.

Bit line BL of memory cell mat MM is electrically connected to column control circuit 14. Column control circuit 14 includes bit line driver BD and sense amplifier SA. Bit line driver BD supplies a predetermined voltage to bit line BL based on a column address signal. Thus, column control circuit 14 performs erasing of data from and writing of data to memory cell MC as well as reading of data from memory cell MC. Sense amplifier SA detects and amplifies current flowing through memory cell MC during the data read operation to determine the data stored in memory cell MC.

Word line WL of memory cell array 12 is electrically connected to row control circuit 16. Row control circuit 16 includes word line driver WD. Row control circuit 16 selects word line WL from memory cell array 12 and controls erasing of data from and writing of data to memory cell MC as well as reading of data from memory cell MC based on a row address signal. Word line driver WD supplies the voltage required for erasing and writing of data to word line WL.

Figure 2:
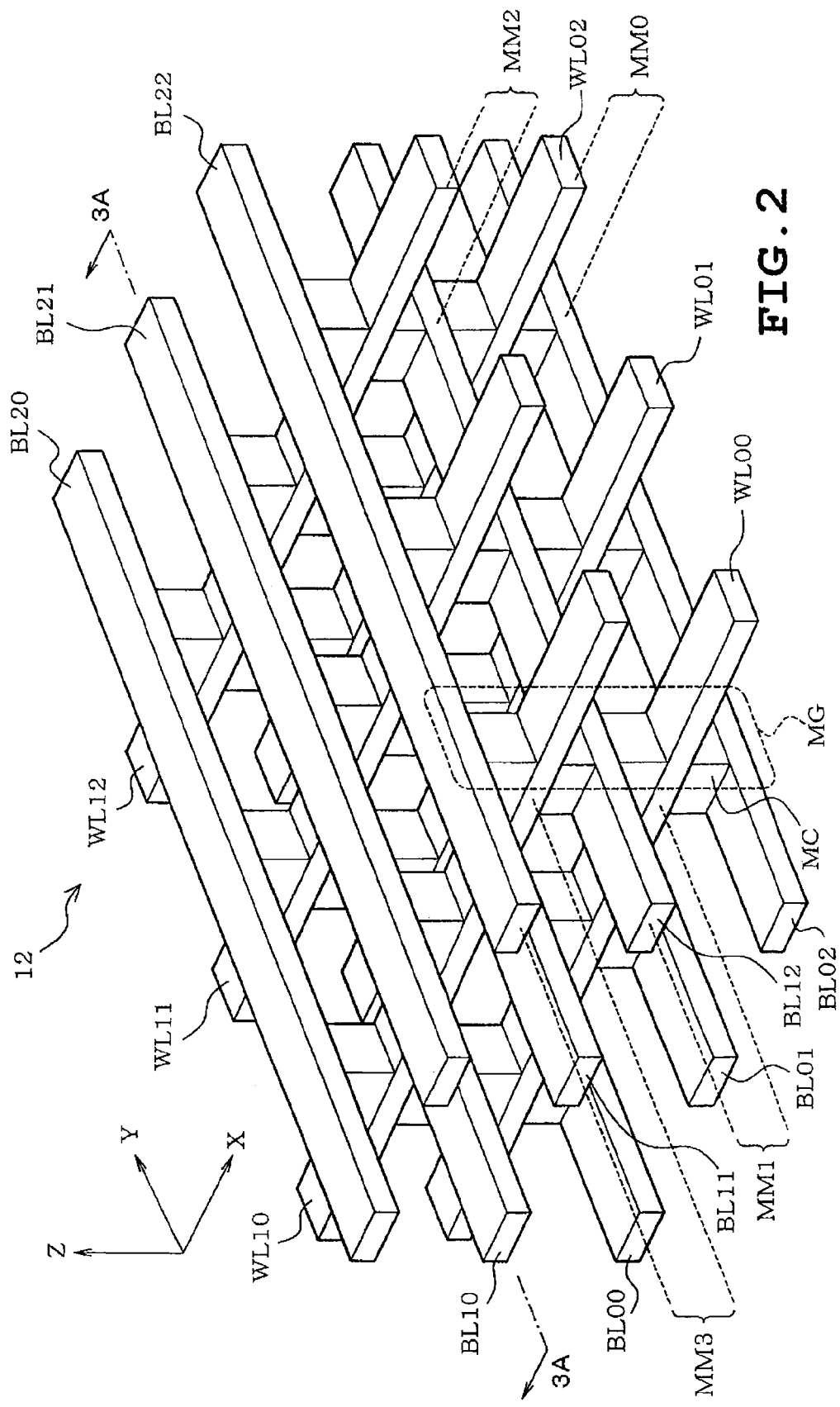
FIG. 2 is one schematic example of a perspective view illustrating a memory cell array in part.

FIG. 2 is one schematic example of a perspective view partially illustrating the structure of memory cell array 12. As shown in FIG. 2, memory cell array 12 is a cross-point type memory cell array. Memory cell array 12 includes memory cell mats MM0 to MM3. In each memory cell mat MM, bit lines BL and word lines WL are stacked three dimensionally.

In FIG. 2, bit lines BL00 to BL02 extend in the Y direction and are spaced by a predetermined distance from one another in the X direction to be arranged in lines and spaces. Word lines WL00 to WL02 are disposed above bit lines BL00 to BL02. Word lines WL00 to WL02 extend in the X direction and are spaced by a predetermined distance from one another in the Y direction to be arranged in lines and spaces. Memory cell mat MM0 is configured by the above described structure.

Above word lines WL00 to WL02, bit lines BL10 to BL12 are further disposed. Bit lines BL10 to BL12 extend in the Y direction and are spaced by a predetermined distance from one another in the X direction to be arranged in lines and spaces. Word lines WL10 to WL12 are further disposed above bit lines BL10 to BL12 so as to similarly intersect three-dimensionally. Memory cell mat MM1 is structured as described above. Memory cell mats MM are stacked in the above described manner to form a multi-layered structure. Memory cell mats MM being stacked in a multi-layered structure results in a three-dimensional and multi-layered matrix arrangement of word lines WL and bit lines BL. Memory cell MC is located at each intersection of word lines WL and bit lines BL so as to be disposed between word line WL and bit line BL. Thus, memory cells MC are disposed in a three-dimensional matrix arrangement.

In one embodiment, memory cell mat MM0 located in the lowermost layer of memory array 12 and memory cell mat MM1 disposed above memory cell mat MM0 share word lines WL00 to WL02. Similarly, memory cell mat MM2 and memory cell mat MM3 share word lines WL10 to WL12.

Materials used in word line WL and bit line BL may include, for example, tungsten (W), titanium (Ti), tungsten nitride (WN), titanium nitride (TiN), tungsten silicide (WSi), nickel silicide (NiSi), and cobalt silicide (CoSi). As shown by dotted lines in FIG. 2, a group of memory cells MC provided at the intersections of bit lines BL and word lines WL are referred to as memory cell group MG.

FIG. 3A is a vertical cross sectional view taken along line 3A-3A of FIG. 2 schematically illustrating a cross section of a single memory cell group MG. FIG. 3B is one example of a vertical cross sectional view schematically illustrating a cross section of a single memory cell MC. FIG. 3C is one example of an equivalent circuit representation of FIG. 3A.

As shown in FIGS. 3A, 3B, and 3C, memory cell mats MM are stacked in the Z direction as viewed in the respective figures. Memory cell MC includes variable resistor 22 and current rectifier 24 series connected between word line WL and bit line BL. Current rectifier 24 may comprise any type of rectifier as long as it possesses predetermined current rectifying characteristics in the voltage-current characteristics. Current rectifier 24 is not limited to a specific material, structure, or the like. One example of current rectifier 24 may be a pn junction diode made of polysilicon (Poly-Si). Further, the pn junction diode may be replaced by various types of diodes such as a Schottky diode, a PIN diode having an i layer, being free of impurities, inserted between a p type layer and an n type layer, or a punch through diode. The material used in current rectifier 24 is not limited to silicon (Si) but may use semiconductors such as silicon germanium (SiGe) or germanium (Ge), a mixed crystal of semiconductor and metal, a metal oxide, or the like.

In current rectifier 24 in memory cell MC, the direction of current rectification varies when bit line BL is disposed above word line WL and when bit line BL is disposed below word line WL. In memory cell MC, current rectifier 24 is configured to have a current rectifying characteristic in which current flows from bit line BL to word line WL. In other words, the rectifying characteristics of current rectifier 24 is configured so that current flows in the forward direction from bit line BL to word line WL.

Variable resistor 22 is an element capable of varying its resistance by, for example, voltage application through intervention of electric current, heat, chemical energy, or the like. Variable resistor 22 may have a barrier metal layer disposed above and below it. The barrier metal layer may serve as an adhesion layer. Barrier metal layer may comprise, for example, platinum (Pt), gold (Au), silver (Ag), Titanium aluminum nitride (TiAlN), strontium ruthenium oxide (SrRuO), ruthenium (Ru), ruthenium nitride (RuN), iridium (Ir), cobalt (Co), titanium (Ti), titanium nitride (TiN), tantalum nitride (TaN), lanthanum nickel oxide (LaNiO), aluminum (Al), platinum iridium oxide (PtIrOx), platinum rhodium oxide (PtRhOx), and rhodium/titanium aluminum nitride (Rh/TaAlN).

Variable resistor 22 may use films such as chalcogenide which is capable of varying its resistance by application of current pulse or voltage pulse. In such case, ReRAM 10 may be configured as a phase change memory in which resistive states caused by a phase transition between crystalline state (low resistance) and amorphous state (high resistance) are used as memory information.

Writing of data to memory cell MC is done by a set operation in which variable resistor 22 is switched from a high resistance state to a low resistance state. The set operation applies a predetermined first voltage on variable resistor 22 of the selected memory cell MC for a predetermined first time period. Erasing of data from memory cell MC, on the other hand, is done by a reset operation in which variable resistor 22 is switched from a low resistance state to a high resistance state. The reset operation applies a second predetermined voltage, lower than the first predetermined voltage applied in the set operation, to variable resistor 22 placed in a low resistance state by the set operation. The second predetermined voltage is applied for a second predetermined time period longer than the first predetermined time period. The reset operation and the set operation are collectively referred to as a switch operation. An element performing the switch operation is referred to as a switching element.

The foregoing description is a brief outline of ReRAM 10 of one embodiment.

Next, the embodiments will be described in detail with reference to FIGS. 4A to 12A, FIGS. 4B to 12B, and FIGS. 4C to 12C.

FIG. 4A to 12A are each an example of a perspective view of memory cell MC region. FIG. 4B to 12B are each an example of a perspective view of a region located in the Y direction from memory cell MC which is, in one embodiment, a hook up portion of bit line BL. FIG. 4C to 12C are each an example of a perspective view of a region located in the X direction from memory cell MC which is, in one embodiment, a hook up portion of word line WL. These figures are referred to for describing the manufacturing process flow of ReRAM 10 of one embodiment.

Figure 4C:
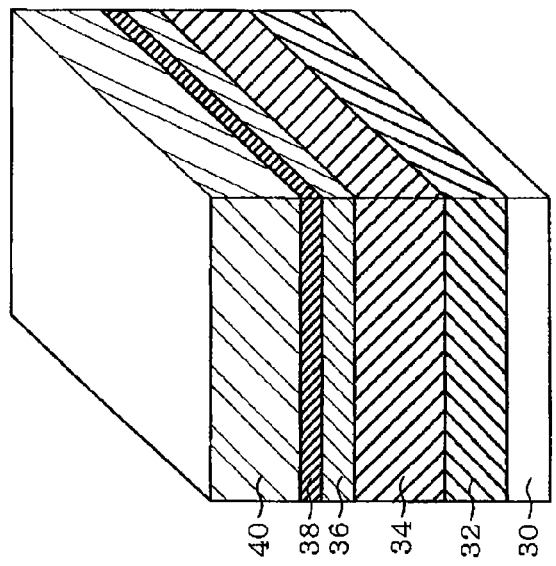
Figure 4B:
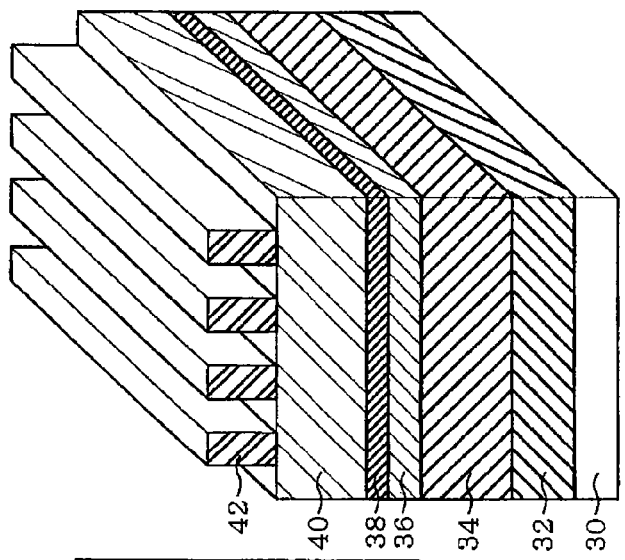
Figure 4A:
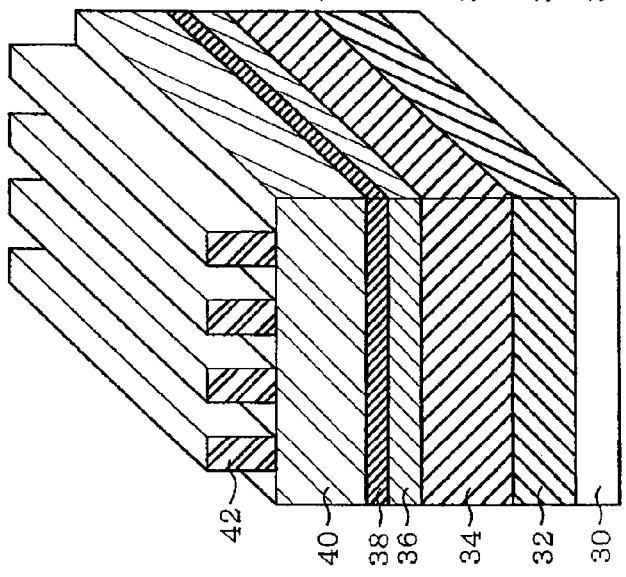

Referring first to FIGS. 4A, 4B, and 4C, base insulating film 30, first conductive film 32, first polysilicon film 34, first switching element film 36, second conductive film 38, and first hard mask layer 40 are formed above a semiconductor substrate not shown. Base insulating film 30 may comprise, for example, a silicon oxide film formed by CVD (Chemical Vapor Deposition) using TEOS (tetraethoxysilane) as a source gas.

First conductive film 32 comprises a metal interconnect employing a metal material. The metal material may comprise a metal film such as a tungsten film formed by CVD. In one embodiment, first conductive film 32 is later formed into bit line BL (BL00 to BL02).

First polysilicon film 34 may comprise a polysilicon film formed by CVD. Impurities are introduced into first polysilicon film 34 so that the lower portion of first polysilicon film 34 becomes a p type and the upper portion of first polysilicon film 34 becomes an n type. First switching element film 36 may comprise a metal oxide film including at least one or more types of elements such as Si, Ti, Ta, Nb, Hf, Zr, W, Al, Ni, Co, Mn, Fe, Cu, and Mo. One example of first switching element film 36 may be a nickel oxide (NiO), a titanium oxide (TiO), or the like. First switching element film 36 may be formed, for example, by sputtering. First switching element film 36 is later formed into variable resistor 22.

First switching element film 36 may comprise a chalcogenide film instead of the metal oxide film. A chalcogenide is an alloy including at least one or more of elements such as germanium (Ge), antimony (Sb), tellurium (Te), indium (In), selenium (Se), or the like. One example of a chalcogenide may be $Ge_2Sb_2Te_5$ (GST) film. Aside from the GST film, other types of chalcogenide films may be used. Examples of a binary element chalcogenide film include GaSb, InSb, InSe, $Sb_2Te_3$, GeTe, or the like. Examples of a ternary element chalcogenide film include $Ge_2Sb_2Te_5$, InSbTe, GaSeTe, $SnSb_2Te_4$, InSbGe, or the like. Examples of a quaternary element chalcogenide film include AgInSbTe, (GeSn)SbTe, GeSb (Sere), $Te_{81}Ge_{15}Sb_2S_2$. The chalcogenide film may be formed, for example, by sputtering. When the chalcogenide film is used as first switching element film 36, ReRAM 10 serves as a phase changing memory.

Second conductive film 38 comprises a metal material. The metal material may comprise a metal film such as a tungsten film formed by CVD. First hard mask layer 40 may comprise, for example, a silicon oxide film formed by CVD using TEOS as a source gas.

Next, photoresist 42 is formed by lithography. Photoresist 42 is patterned into a shape of bit lines BL so as to extend in the Y direction and be aligned in the X direction in a line and space arrangement. Photoresist 42 is not formed in the region illustrated in FIG. 4C.

Figure 5A:
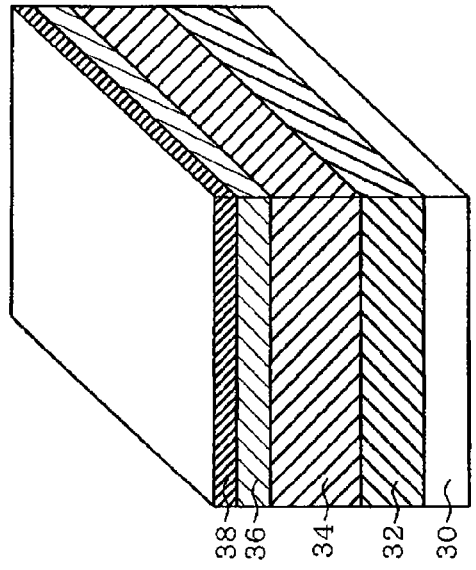
Figure 5B:
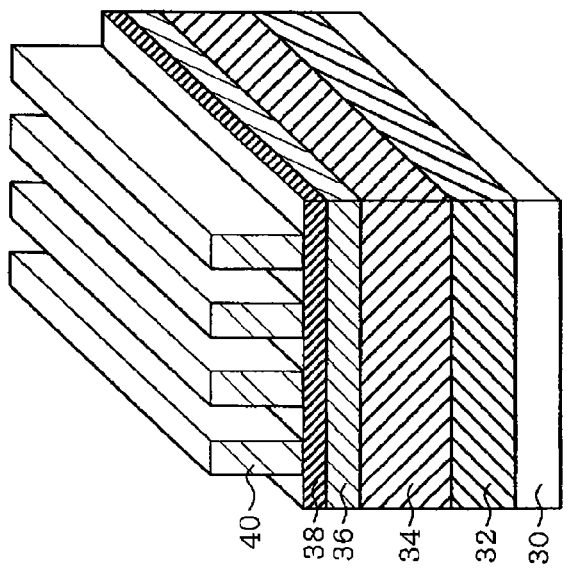
Figure 5C:
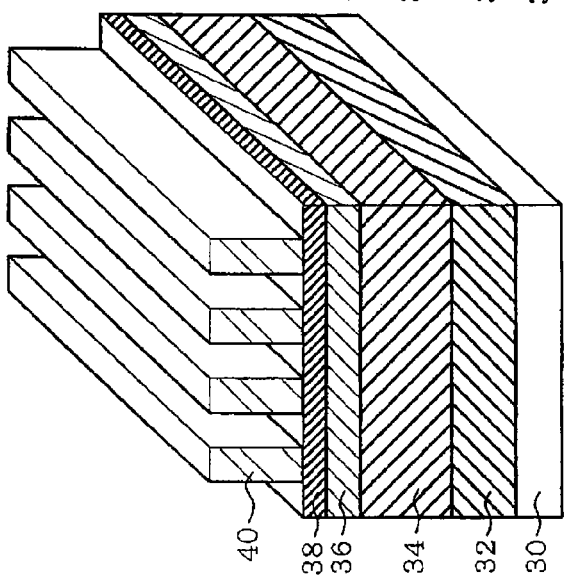

As shown in FIGS. 5A, 5B, and 5C, photoresist 42 is used as a mask to pattern first hard mask layer 40 by selective etching using RIE (Reactive Ion Etching). The RIE is carried out under anisotropic conditions. Then, photoresist 42 is removed, for example, by ashing using oxygen plasma. As a result, the shape of photoresist 42 is transferred to first hard mask layer 40 to pattern first hard mask layer 40 into the shape of bit line BL. Because photoresist 42 is not formed in the region illustrated in FIG. 5C, first hard mask layer 40 is entirely removed from this region to expose the upper surface of second conductive film 38.

Figure 6C:
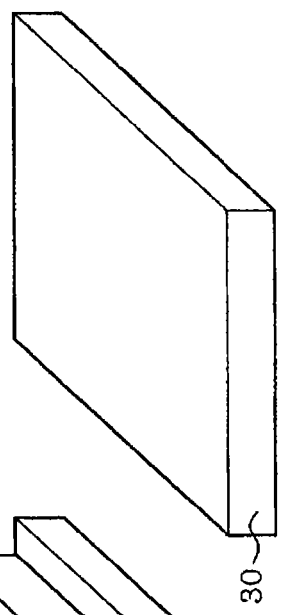
Figure 6B:
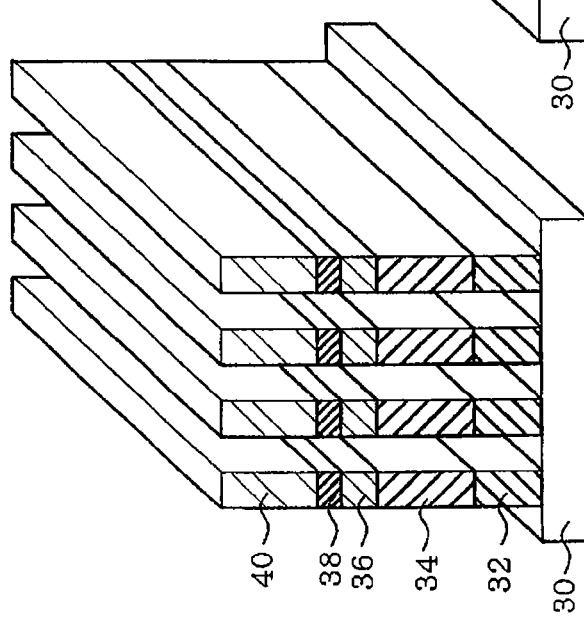
Figure 6A:
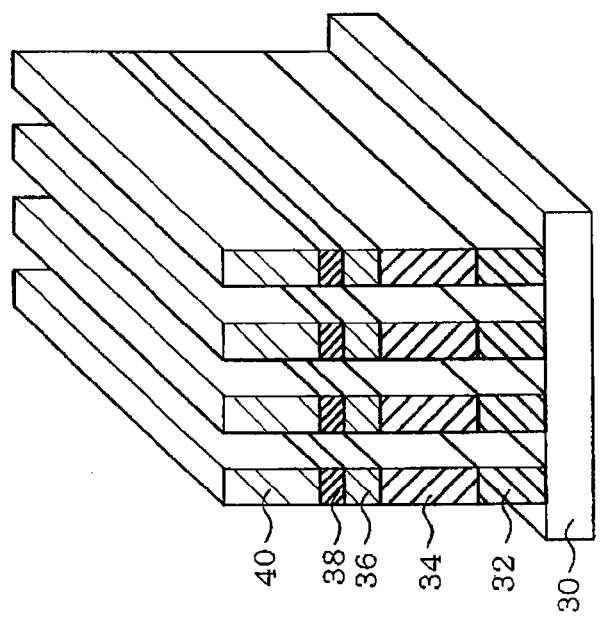

As shown in FIGS. 6A, 6B, and 6C, using first hard mask layer 40 as a mask, second conductive film 38, first switching element film 36, first polysilicon film 34, and first conductive film are etched one after another by RIE under anisotropic conditions.

Because the shape of first hard mask layer 40 is transferred to these films, the films are patterned into the shape of bit lines BL extending in the Y direction and being aligned in the X direction in a line and space arrangement. The etching uses base insulating film 30 as a stopper. In the region illustrated in FIG. 6C, second conductive film 38, first switching element film 36, first polysilicon film 34, and first conductive film 32 are entirely removed so that base insulating film 30 is exposed throughout the entire surface of this region.

As shown in FIGS. 7A, 7B, and 7C, first interlayer insulating film 44 is formed throughout the entire surface. First interlayer insulating film 44 may comprise, for example, a silicon oxide film formed by CVD (Chemical Vapor Deposition) using TEOS (tetraethoxysilane) as a source gas. First interlayer insulating film 44 is formed under conditions providing good step coverage. First interlayer insulating film 44 is formed conformally along the surface of structure (memory cell MCO) comprising first conductive film 32, first polysilicon film 34, first switching element film 36, and second conductive film 38 so as to fill the gaps between the structures and further cover the upper portions of the structures.

Then, first interlayer insulating film 44 is polished and planarized by CMP (Chemical Mechanical Polishing) using second conductive film 38 as a stopper. Thus, a planar surface flush with the upper surface of second conductive film 38 is obtained in which gaps between the structures are filled with first interlayer insulating film 44. The surface of the region illustrated in FIG. 7C is covered throughout by a planarized first interlayer insulating film 44. The height of the upper surface of the planarized first interlayer insulating film 44 is substantially level with the upper surfaces of second conductive films 38 illustrated in FIGS. 7A and 7B.

Then, as shown in FIGS. 8A, 8B, and 8C, third conductive film 52, second polysilicon film 54, second switching element film 56, fourth conductive film 58, and second hard mask layer 60 are formed one after another. Third conductive film 52 may comprise a metal material such as tungsten formed, for example, by CVD. In one embodiment, third conductive film 52 is later formed into word lines WL (WL00 to WL02).

Second polysilicon film 54 may comprise a polysilicon film formed by CVD. Impurities are introduced into second polysilicon film 54 so that the lower portion of second polysilicon film 54 becomes an n type and the upper portion of second polysilicon film 54 becomes a p type. This is opposite of first polysilicon film 34 in which the lower portion of first polysilicon film 34 is a p type and the upper portion of first polysilicon film 34 is an n type. Second switching element film 56 may be made of the same material and in the same way as first switching element film 36. Second switching element film 56 is later formed into variable resistor 22.

Second switching element film 56, comprising the aforementioned metal oxide film, may alternatively comprise a chalcogenide film. In case second switching element film 56 comprises a chalcogenide film, ReRAM 10 serves as a phase changing memory.

Fourth conductive film 58 comprises the same metal material used for second conductive film 38, one example of which may be tungsten. Fourth conductive film 58 is later formed into bit line BL (BL10 to BL12). Second hard mask layer 60 may comprise, for example, a silicon oxide film formed by CVD using TEOS as a source gas.

Next, photoresist 62 is formed by lithography. Photoresist 62 is patterned into a shape of word lines WL so as to extend in the X direction and be aligned in the Y direction in a line and space arrangement. Photoresist 62 is not formed in the region illustrated in FIG. 8B.

As shown in FIGS. 9A, 9B, and 9C, photoresist 62 is used as a mask to pattern second hard mask layer 60 by selective etching using RIE (Reactive Ion Etching). The RIE is carried out under anisotropic conditions. Then, photoresist 62 is removed, for example, by ashing using oxygen plasma. As a result, the shape of photoresist 62 is transferred to second hard mask layer 60 to pattern second hard mask layer 60 into the shape of word line WL. Because photoresist 42 is not formed in the region illustrated in FIG. 9B, second hard mask layer 60 is entirely removed from this region to expose the upper surface of fourth conductive film 58.

As shown in FIGS. 10A to 12C, fourth conductive film 58 to first conductive film 32 are etched one after another by RIE under anisotropic conditions. The films are etched by multiple process steps within the etching process. FIGS. 10A, 10B, and 10C illustrate the initial process step in which second hard mask layer 60 is used as a mask to etch fourth conductive film 58, second switching element film 56, second polysilicon film 54, and third conductive film 52 one after another by RIE under anisotropic conditions. Because the shape of second hard mask layer 60 is transferred to these films, the films are patterned into the shape of word lines WL extending in the X direction and being aligned in the Y direction in a line and space arrangement. The etching uses first interlayer insulating film 44 and second conductive film 38 as stoppers. In the region illustrated in FIG. 10B, fourth conductive film 58, second switching element film 56, second polysilicon film 54, and third conductive film 52 are entirely removed so that the upper surfaces of first interlayer insulating film 44 and second conductive film 38 are exposed.

Figures 11A, 11B, 11C:
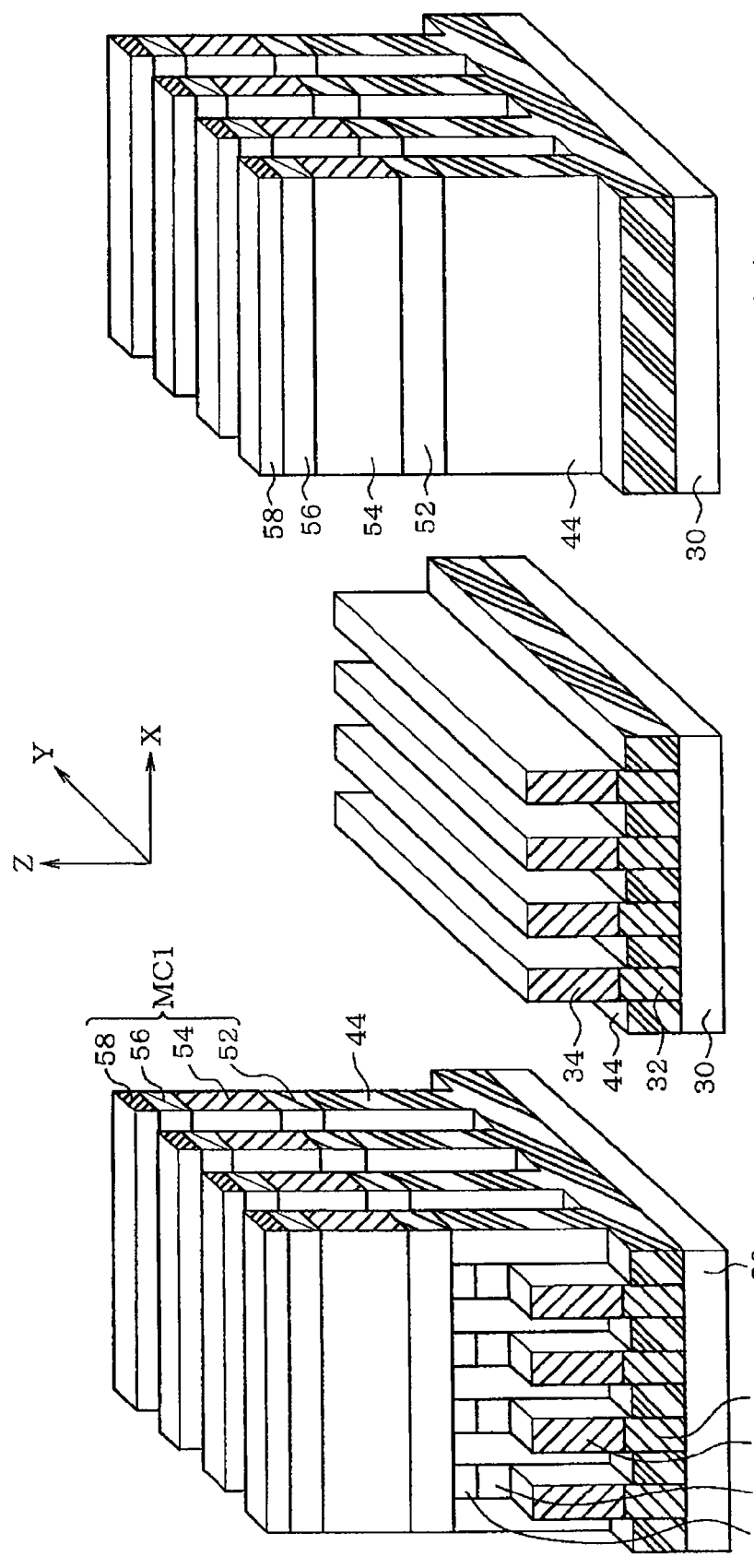

In the process step shown in FIGS. 11A, 11B, and 11C, second hard mask layer 60 is used as a mask to etch second conductive film 38 and first switching element film 36. In the next process step, first interlayer insulating film 44 is etched by RIE under anisotropic conditions.

In etching first interlayer insulating film 44, fluorocarbon gases such as $C_3F_6$, $C_4F_8$, $CF_4$, $CHF_3$, and $CH_2F_2$, and $CH_3F$ are used. Because both first interlayer insulating film 44 and second hard mask layer 60 comprise a silicon oxide film, second hard mask layer 60 is etched away during the etching of first interlayer insulating film 44. Fourth conductive film 58 serves as the etch mask after second hard mask layer 60 has been etched away. The etching of first interlayer insulating film 44 is stopped at the elevation which is almost as high as the upper surface of first conductive film 32. First polysilicon film 34 remains unetched.

In the process step indicated in FIGS. 12A, 12B, and 12C, first polysilicon film 34 is anisotropically etched by RIE. The etching of first polysilicon film 34 is performed with selectivity to first conductive film 32 (tungsten) using HBr-based gas. The etching is stopped when the upper surface of first conductive film 32 is exposed.

In the process step of RIE dry etching illustrated in FIGS. 10 to 11, second conductive film 38 and first conductive film 32 are etched. Second conductive film 38 and first conductive film 32 comprise a metal interconnect employing a metal material. The metal material may comprise, for example, tungsten. The metal material may be ejected during the etching by the sputtering effect imparted by the ions of the etch gas species. The ejected metal material may develop into deposits at the bottom portion of the pattern. Development of deposits, containing metal material such as tungsten, may bridge the gap between the adjacent first conductive films 32, for example, and cause electrical failures such as shorting of the adjacent first conductive films 32 (i.e. bit lines BL).

In one embodiment, when etching is carried out in the presence of metal material such as tungsten, the following process step is performed in-situ without unloading the semiconductor substrate from the processing chamber of the etching apparatus after the etching. In other words, the following cleaning step is carried out immediately after the etching of first polysilicon film 34. The cleaning step is carried out by generating plasma in an ambient using gas species primarily comprising $BCl_3$. For example, the gas species may be composed primarily of $BCl_3$ with $Cl_2$, HBr, and $O_2$ additives. The recipe for generating plasma may include: pressure of 5 to 50 [mTorr], $BCl_3$ gas flow of 40 to 300 [sccm], additive gas flow of 2 to 40 [sccm], and source power of 350 to 1800 [W] and bias power of 0 to 100 [W] as RF power. In one embodiment, the bias power is set to 0 [W] (nonbiased state) or to a low power of 100 [W] or less at most and $BCl_3$ is used as the processing gas species. As a result, it is possible to selectively remove the deposits containing metal material while keeping the etch rate of metal material low.

The cleaning step needs to meet the requirement of selectively removing the deposits containing the metal material without affecting the metal material such as tungsten used in first conductive film 32, second conductive film 38, third conductive film 52, fourth conductive film 58, and the like.

The cleaning step further needs to inhibit its influence on first polysilicon film 34, second polysilicon film 54 (polysilicon), or first interlayer insulating film 44 (silicon oxide film). Thus, in one embodiment, the etch rate is lowered by setting the bias power to a nonbiased state or to a significantly low level. As a result, influence on films other than the deposits can be reduced by reducing the etch rate of metal materials, polysilicon, silicon oxide film, or the like.

Through research, the inventor has found that the use of $BCl_3$ as the main processing gas species facilitates the selective removal of deposits in the cleaning step. Thus, in one embodiment, the cleaning step uses $BCl_3$ as main processing gas species. By using $BCl_3$ as main processing gas species, it is possible to selectively remove the deposits containing metal material while inhibiting the etching of metal interconnect (metal material), polysilicon film, silicon oxide film, or the like.

In one embodiment, the cleaning step is carried out in-situ without taking the workpiece, i.e. the semiconductor substrate out of the etching apparatus. As a result, it is possible to inhibit re-reaction of the deposits with moisture or various gases in the ambient, thereby preventing the removal of deposits from becoming even more difficult.

In the cleaning step of one embodiment, ICP (Inductively Coupled Plasma) type RIE apparatus is preferably used as it provides a preferable form of discharge for controlling the bias power independent of the source power. Other types of etching apparatuses may be used instead of the ICP type RIE apparatus as long as the bias power can be controlled to a nonbiased state or to a significantly low level independent of the source power.

By performing the cleaning step described above, the deposits including metal material such as tungsten can be removed efficiently without affecting the metal interconnect layer, the polysilicon film, and the silicon oxide film.

The process step illustrated in FIGS. 10A, 10B, and 10C to the cleaning step illustrated in FIGS. 12A, 12B, and 12C may be carried out as series of process steps within a single etching process. The process steps may be carried out within the same processing chamber of the etching apparatus.

In case the etching apparatus is a multi-chamber etching apparatus in which the semiconductor substrate can be carried from one processing chamber to another while maintaining vacuum, the transport of semiconductor substrate between the processing chambers is permissible. In such case, the etching step and the cleaning step may be carried out in different processing chambers.

Going back to the description of the manufacturing process flow, the above described cleaning step is followed by formation of an interlayer insulating film to fill the gaps between the patterns. Then, the process steps illustrated in FIGS. 4A, 4B, and 4C to FIGS. 12A, 12B, and 12C are repeated required number of times to obtain a nonvolatile semiconductor storage device provided with memory cell array 12 illustrated in FIG. 2.

In one embodiment, a cleaning step is carried out in-situ after patterning the stacked structure including metal material by etching without removing the semiconductor substrate from the etching chamber in which the etching was performed. The cleaning step uses BCl₃ as main processing gas species. In the cleaning step, a cleaning condition is employed in which the bias power is set to 0 [W] (nonbiased state) or to a significantly low power to generate plasma. The etching apparatus used in the cleaning step is preferably an ICP type RIE apparatus. It is possible to selectively and efficiently remove the deposits containing metal material by setting the bias power to 0 [W] (nonbiased state) or to a significantly low level and using BCl₃ as main processing gas species. As a result, it is possible to inhibit electrical failures such as shorting of the adjacent patterns and thereby provide a highly reliable semiconductor device.

Other Embodiments

The embodiments described above were described through an example of a semiconductor device, and more specifically through a ReRAM application. Other embodiments may be directed to other semiconductor storage devices such as a NAND or NOR flash memory, EERROM, DRAM, SRAM, or the like, or to logic devices as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming a first stack of films including a first metal film, a first polysilicon film, a first switching element film, a second metal film, and a first hard mask layer above a semiconductor substrate;
    patterning the first stack of films by a first dry etching;
    forming an insulating film so as to cover the first stack of films;
    planarizing the insulating film by chemical mechanical polishing;
    forming a second stack of films including a third metal film, a second polysilicon film, a second switching element film, a fourth metal film, and a second hard mask layer;
    patterning the first stack of films and the second stack of films by a second dry etching; and
    cleaning including generation of plasma in an ambient including BCl₃ and controlling a bias power to a nonbiased state.

2. The method according to claim 1, wherein the second dry etching is carried out in an etching chamber and the cleaning immediately following the second dry etching is carried out without removing the semiconductor substrate from the dry etching chamber.

3. The method according to claim 1, wherein the first polysilicon film and the second polysilicon film each include a portion of a first conductivity type and a portion of a second conductivity type stacked one over the other.

4. The method according to claim 3, wherein, in the first polysilicon film and the second polysilicon film, the portion of the first conductivity type includes at least either of phosphorous and arsenic, and the portion of the second conductivity type includes boron.

5. The method according to claim 4, wherein, in the first polysilicon film, the portion of the first conductivity type is located in a first metal film side, and the portion of the second conductivity type is located in a second metal film side, and
    wherein, in the second polysilicon film, the portion of the second conductivity type is located in a third metal film side and the portion of the first conductivity type is located in a fourth metal film side.

6. The method according to claim 1, wherein the first metal film and the second metal film each comprise tungsten.

7. The method according to claim 1, wherein the first switching element film includes a metal oxide film or a chalcogenide film.

8. The method according to claim 1, wherein the first hard mask layer and the second hard mask layer each comprise a silicon oxide film.

9. The method according to claim 1, wherein the insulating film comprises a silicon oxide film.

10. The method according to claim 1, wherein the third metal film and the fourth metal film each comprise tungsten.

11. The method according to claim 1, wherein the second switching element film includes a metal oxide film or a chalcogenide film.

* * * * *